United States Patent
Nakamura et al.

[11] Patent Number: 5,823,418
[45] Date of Patent: Oct. 20, 1998

[54] DIE TRANSPORTING DEVICE

[75] Inventors: Osamu Nakamura; Tsuneharu Arai, both of Tokyo, Japan

[73] Assignee: Kabushiki Kaisha Shinkawa, Tokyo, Japan

[21] Appl. No.: 699,235

[22] Filed: Aug. 19, 1996

[30] Foreign Application Priority Data

Aug. 18, 1995 [JP] Japan .................................. 7-232111

[51] Int. Cl.⁶ .................................................. H01L 21/00
[52] U.S. Cl. ........................................ 228/49.5; 414/941
[58] Field of Search .................................. 228/49.5, 6.1, 228/6.2; 414/225, 935, 936, 941

[56] References Cited

U.S. PATENT DOCUMENTS

| | | | |
|---|---|---|---|
| 4,042,128 | 8/1977 | Shrader | 414/941 |
| 4,904,153 | 2/1990 | Iwasawa et al. | 414/940 |
| 5,403,397 | 4/1995 | Beckers et al. | 414/935 |
| 5,516,732 | 5/1996 | Flegal | 414/935 |

*Primary Examiner*—Samuel M. Heinrich
*Attorney, Agent, or Firm*—Koda & Androlia

[57] ABSTRACT

A device for transporting a die from a die pick-up position to a die placement position in the process of manufacturing, for instance, semiconductor devices, including a slider which is vertically movable, a suction holding nozzle installed on the slider, a feeder screw which causes a horizontal movement of the slider, a transport guide shaft which guides the slider so as to make its horizontal movement, a pair of pivotal swing levers respectively installed above the die pick-up position and the die placement position so as to guide the slider to ascend and descend, and driving cams which cause the pivot motions of the swing levers.

5 Claims, 7 Drawing Sheets

DIE TRANSPORTING DEVICE

BACKGROUND OF THE INVENTION

1. Field of the Invention

The present invention relates to a die transporting device used in a bonding apparatus such as a die bonding apparatus or tape bonding apparatus, etc.

2. Prior Art

In the workpieces treated by a bonding apparatus such as a die bonding apparatus, etc., a plurality of dies are arranged in rows in the X and Y directions and bonded to a wafer sheet, and the circumferential portions of the wafer sheet are pasted to a wafer ring, which is set on a die push-up device.

In the die pick-up position of the die push-up device, the wafer sheet to which the dies are bonded is held by a wafer sheet suction holding assembly of the die push-up device, and the dies are pushed up by a push-up needle. The thus pushed up die are then held by a suction holding nozzle and separated from the wafer sheet. Then, after the suction holding nozzle (which is holding the die) is raised, the suction holding nozzle is moved to a die placement position of a die placement stage such as a bonding stage or die positioning stage, etc. Afterward, the suction holding nozzle is lowered, and the die is bonded to a lead frame on the die placement stage or is merely placed on the die placement stage. In cases where the die placement stage is a die positioning stage, the die placed on the die positioning stage is positioned by a positioning means and is then chucked by a separate suction holding nozzle and bonded to a lead frame on a bonding stage.

Typically, in a bonding apparatus, there is a strong demand for increased operation speed in order to increase productivity. However, in the prior art described above, considerable time is required for the die transporting operation, because each die is picked up at a die pick-up position, raised, moved horizontally and then positioned in the die placement position.

SUMMARY OF THE INVENTION

Accordingly, the object of the present invention is to provide a die transporting device in which the die transport time is shortened so as to improve productivity.

The object is accomplished by a unique structure of the present invention for a die transporting device which comprises:

- a slider rail having a guide surface which is vertically oriented,
- a slider which is installed so as to be ascended and descended on the slider rail,
- a suction holding nozzle attached to the slider via a nozzle attachment lever,
- a horizontal driving means which causes the slider to make a horizontal movement so that the suction holding nozzle is moved from a die pick-up position to a die placement position,
- a transport guide member installed horizontally so as to regulate an upper-limit position of an ascending movement of the slider during a horizontal movement of the slider rail,
- a pair of raising-and-lowering swing levers which are respectively installed in a pivotal fashion above the die pick-up position and above the die placement position so as to guide the slider to be ascended and descended, and
- a raising-and-lowering driving means which causes a pivot motion of the pair of raising-and-lower swing levers, supporting shafts for the pair of raising-and-lowering swing levers being installed on inner sides relative to a horizontal direction that is perpendicular to a direction in which the transport guide member extends.

With the above structure, the suction holding nozzle can be moved between the die pick-up position and the die placing position rapidly, so that die transport time can be shortened and productivity can be improved.

DETAILED DESCRIPTION OF THE PREFERRED EMBODIMENTS

Below, one embodiment of the present invention will be described with reference to FIGS. 1 through 10.

Figure 1:
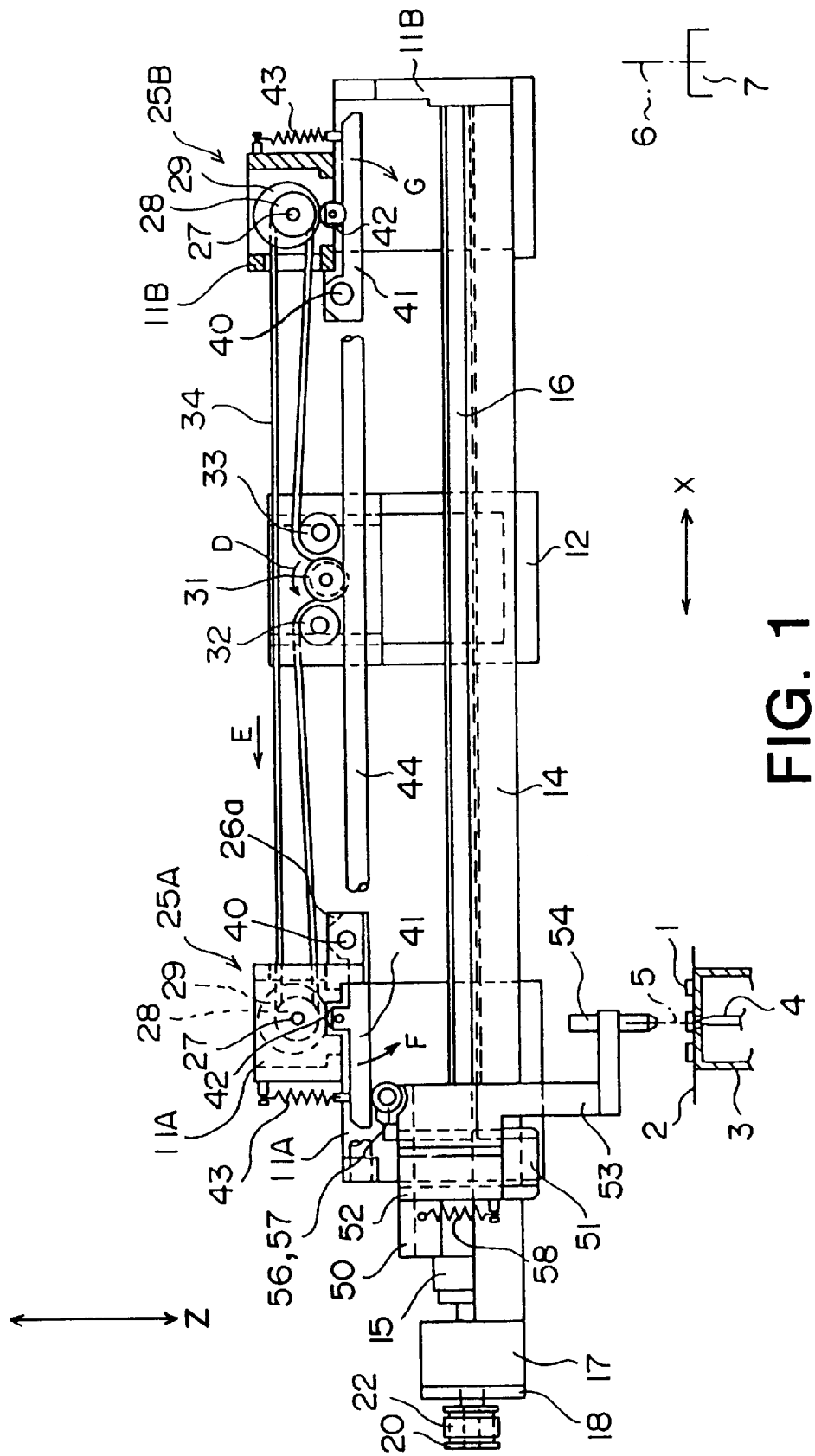
FIG. 1 is a front view which illustrates one embodiment of the die transporting device of the present invention.

As shown in FIG. 1, a wafer sheet 2 to which dies 1 are bonded is held by a suction holding assembly 3 of a die push-up device; and in this state, the dies 1 are pushed upward by a push-up needle 4. A die placement position 6 is located at a position separate from a die pick-up position 5 which is on the imaginary vertical line extended from the push-up needle 4. There is a die placement stage 7 at the die placement position 6. The die placement stage 7 can be a bonding stage on which a lead frame (not shown) is positioned and placed, or it can be a die positioning stage.

The above structure is well known in the prior art, and therefore, no further explanation is given below.

The details of the structure of the die transporting device which transports dies 1 from the die pick-up position 5 to the die placement stage 7 of this invention will be described below. In the following description, the horizontal direction of an imaginary line connecting the die pick-up position 5 and the die placement position 6 will be referred to as the "X direction", and the horizontal direction perpendicular to the X direction will be referred to as the "Y direction" (thus, the Y direction is perpendicular to the surface of the drawing sheet for FIG. 1).

Figure 2:
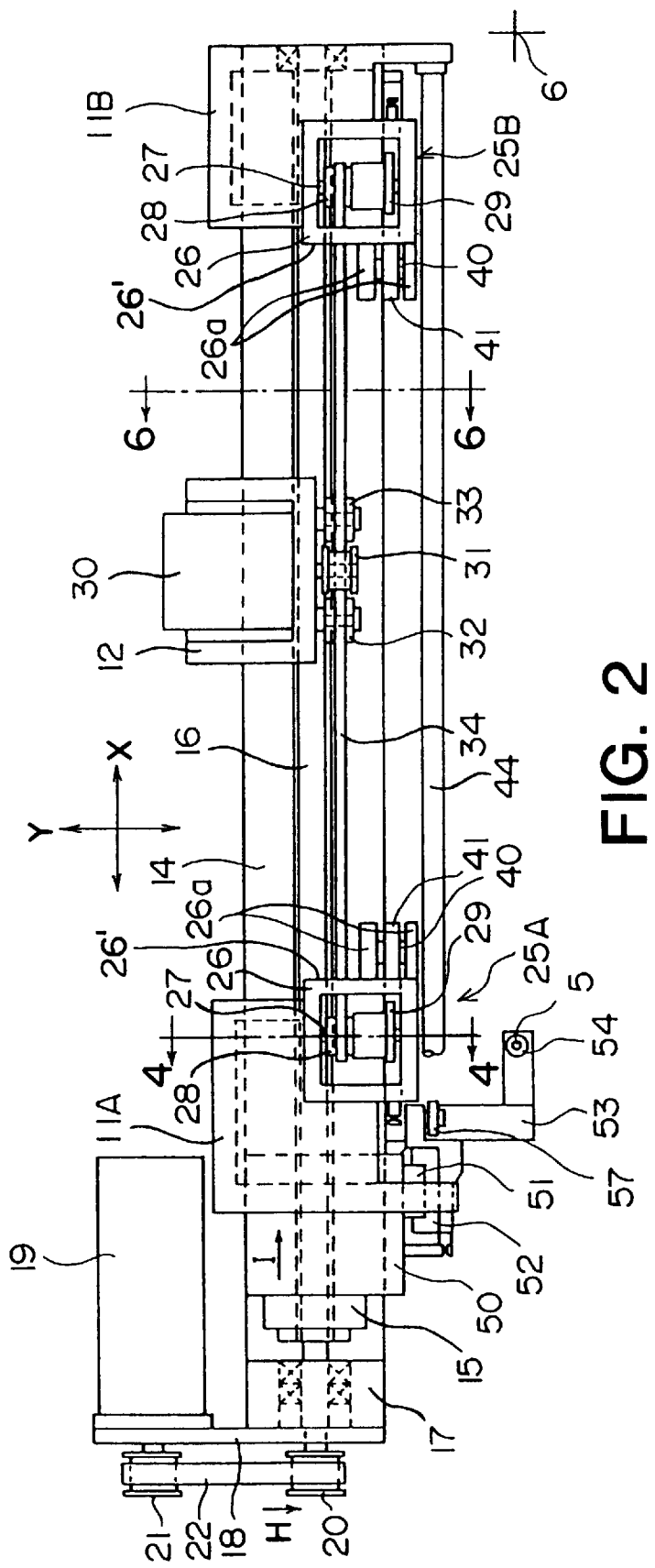
FIG. 2 is a top view thereof.
Figure 4:
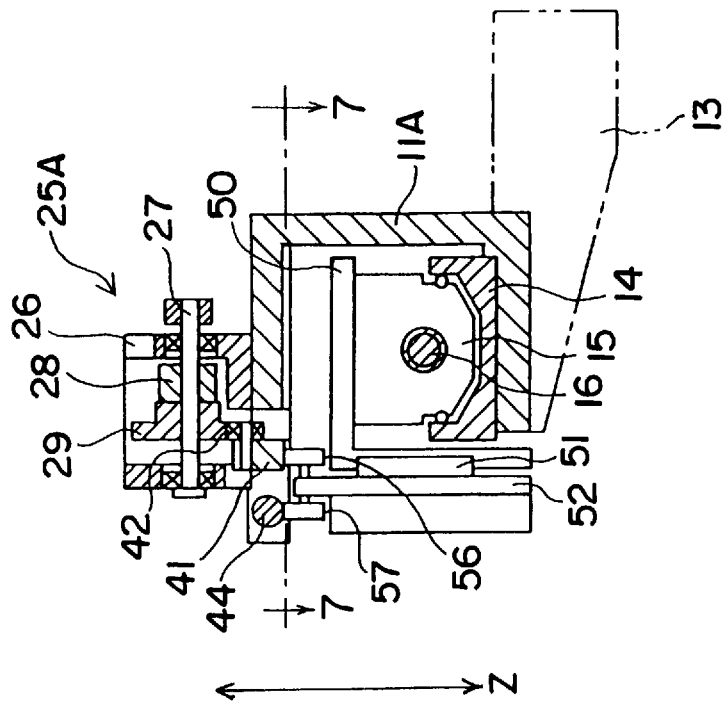
FIG. 4 is a sectional view taken along the line 4—4 in FIG. 2.
Figure 5:
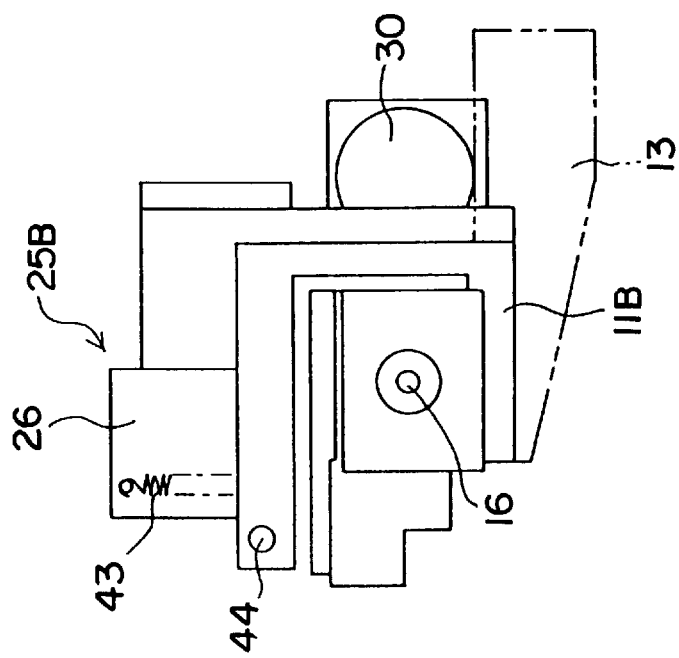
FIG. 5 is a right-side view of the device shown in FIG. 2.
Figure 6:
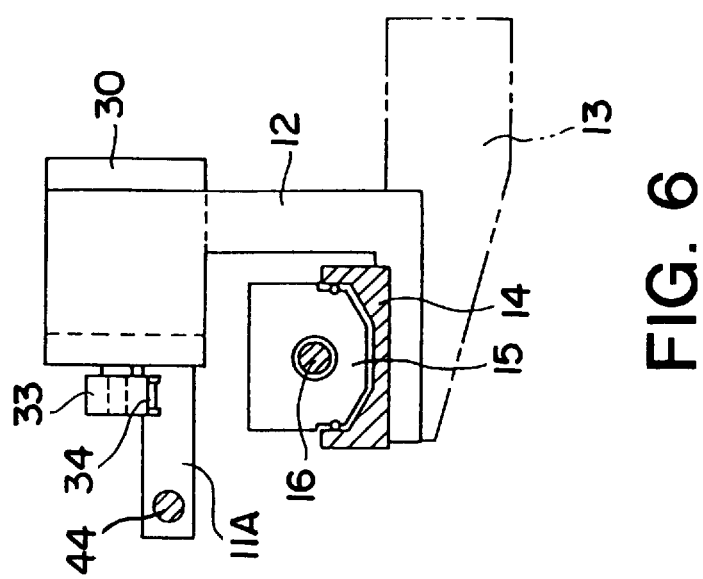
FIG. 6 is a sectional view taken along the line 6—6 in FIG. 2.

As shown in FIGS. 1 and 2, a first supporting block 11A and a second supporting block 11B are provided on the sides of the die pick-up position 5 and die placement position 6, respectively; and a third or central supporting block 12 is provided between the first and second supporting blocks 11A and 11B. As shown in FIGS. 4 through 6, these supporting blocks 11A, 11B and 12 are provided on a fixed structural member 13 of the transporting device.

A transportation rail 14, which is substantially an inverted U-shape in cross section (see FIG. 4) and extends in the X direction, is fastened to the bottom surfaces of the supporting blocks 11A, 11B and 12; and a ball slider 15 which has an internal screw thread is slidably installed on the transportation rail 14. The transportation rail 14 and ball slider 15 make a "paired element", and the "paired element" used in this embodiment is one marketed with the trademark "Monocarrier" manufactured by NSK Kabushiki Kaisha, Japan.

A feed screw 16 having an external screw thread is installed in the X direction, and its screw thread is engaged with the internal screw thread of the ball slider 15. As seen from FIGS. 1 and 2, one end of the feed screw 16 is rotatably supported by the supporting block 11B, and the other end of the feed screw 16 is rotatably supported on a supporting plate 17 which is fastened to the end (left end in FIG. 1) of the transportation rail 14.

A motor mount 18 is provided on the supporting plate 17, and a horizontal driving motor 19 is mounted on this motor mount 18. In addition, a belt 22 is provided on a pulley 20 coupled to the end of the feed screw 16 and a driving pulley 21 coupled to the output shaft of the horizontal driving motor 19. Thus, when the horizontal driving motor 19 is actuated, the feed screw 16 is rotated and the ball slider 15 can move horizontally.

As shown in FIGS. 1, 2, 4, 5, 8, 9 and 10, suction holding nozzle raising-and-lowering driving assemblies (called "suction nozzle drivers") 25A and 25B are respectively provided on the supporting blocks 11A and 11B. Both of the suction nozzle drivers 25A and 25B are substantially the same in structure and have left-right symmetric configurations; accordingly, the same or corresponding parts in both driving assemblies will be described using the same reference numerals.

In particular, supporting frames 26 of the suction nozzle drivers are open in the vertical direction as shown in from FIG. 2, and the mutually facing inside surfaces are also open as seen from FIG. 4; and these frames 26 are secured to the supporting blocks 11A and 11B.

Cam shafts 27 which extend in the Y direction are rotatably provided in the supporting frames 26, and a pulley 28 and a raising-and-lowering driving cam 29 are, as best seen in FIG. 4, fastened to each of the cam shafts 27.

A raising-and-lowering driving motor (called "vertical driving motor") 30 is provided on the central supporting block 12, and a pulley 31 is coupled to the output shaft of this vertical driving motor 30. In addition, tension rollers 32 and 33 are rotatably provided on the central supporting block 12 so as to be next to the pulley 31. In addition, as best seen from FIG. 1, a belt 34 is provided on the pulleys 28 of the first and second supporting blocks 11A and 11B and the pulley 31 and tension rollers 32 and 33 of the central supporting block 12.

As seen from FIGS. 1 and 2, lever supports 26a are provided on the lower portions of the inner side surface 26', which face each other, of the supporting frames 26 of the suction nozzle drivers 25A and 25B. In other words, the lever supports 26a are on the right side of the suction nozzle driver 25A and on the left side of the suction nozzle driver 25B as best seen from FIG. 2. In addition, a supporting shaft 40 which extends in the Y direction is rotatably provided in each lever support 26a.

A raising-and-lowering swing lever (called "swing lever") 41 which extends in the X direction beneath the raising-and-lowering driving cam 29 is pivotally provided at its one end on each supporting shaft 40, and a roller 42 (see FIG. 1) which faces and contacts the raising-and-lowering driving cam 29 is rotatably provided on the swing lever 41. Furthermore, a spring 43 is installed between each supporting frame 26 and the corresponding swing lever 41 so that the roller 42 is pressed against the corresponding raising-and-lowering driving cam 29.

A transport guide shaft 44 is installed in the X direction so as to be positioned on the side of the swing levers 41. The guide shaft 44 is supported at its both ends by the supporting blocks 11A and 11B.

As shown in FIGS. 1 through 4 and FIG. 7, a moving plate 50 is fastened to the ball slider 15, and a slider rail 51 is attached in a vertical attitude on one side (front side or left side in FIG. 4) of the moving plate 50. A vertical slider 52 is fitted over the slider rail 51 so that the slider 52 is slidable upward and downward or in the direction of arrows Z in FIGS. 1 and 4.

A nozzle attachment lever 53 is mounted to the vertical slider 52, and a suction holding nozzle 54 is attached to this nozzle attachment lever 53 so that the suction holding nozzle 54 can be positioned in the die pick-up position 5 and in the die placement position 6. A pipe (not shown) is connected at its one end to the upper end (in FIG. 1) of the suction holding nozzle 54, and its other end is connected to a vacuum pump (not shown).

Figure 3:
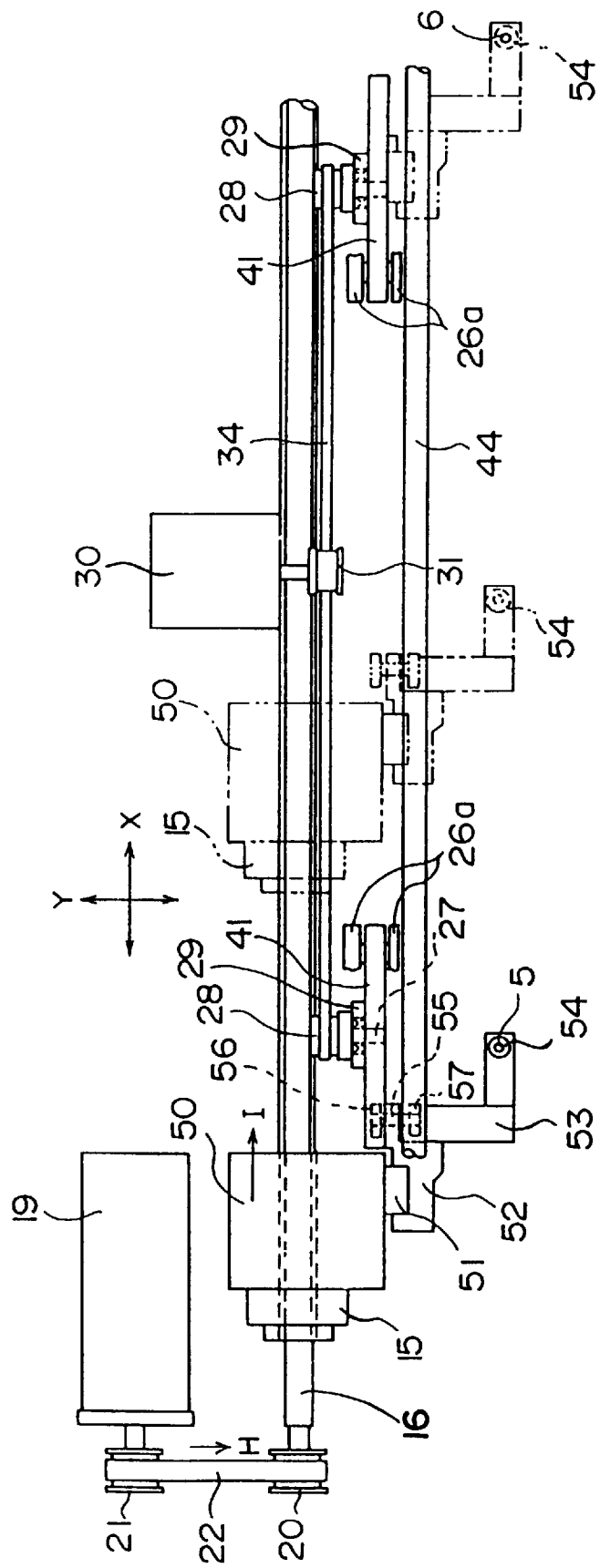
FIG. 3 is a top view which shows the essential portion of the device.
Figure 7:
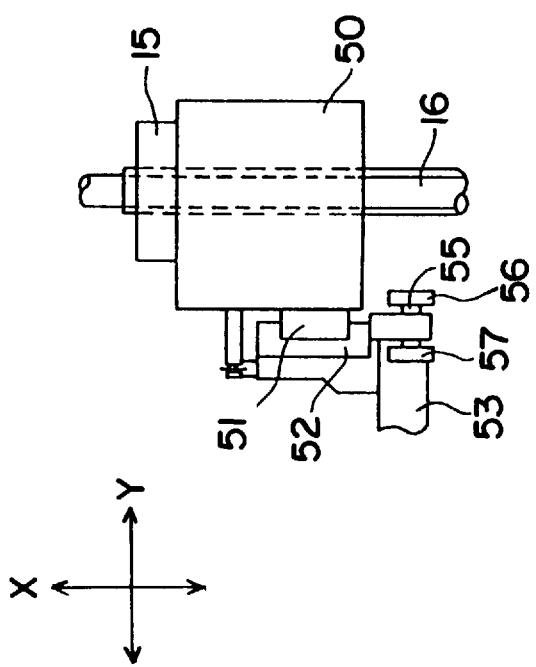
FIG. 7 is a sectional view taken along the line 7—7 in FIG. 4.

A roller shaft 55, as best seen from FIGS. 3 and 7, which extends in the Y direction is mounted to the upper portion of the vertical slider 52, and rollers 56 and 57 are provided on the roller shaft 55 in a rotatable fashion. As shown in FIG. 4, the rollers 56 face the undersurfaces of the swing levers 41, and the rollers 57 face the undersurface of the transport guide shaft 44.

A spring 58 is (see FIG. 1) installed between the moving plate 50 and the vertical slider 52 so that the rollers 56 and 57 are pressed against the swing lever 41 of the nozzle driver 25A and the transport guide shaft 44, respectively.

The operation of the die transporting device will now be described below.

As shown by the solid lines in FIGS. 1, 2 and 3 and in FIG. 7, the operation is initiated from a state in which the nozzle attachment lever 53 is positioned above the die pick-up position 5 which is on the die 1 that is to be picked up.

First, the vertical driving motor 30 is actuated so as to rotate in the forward direction. As a result, the pulley 31 is rotated in the direction indicated by arrow D in FIG. 1, and the belt 34 is rotated in the direction of arrow E. The raising-and-lowering driving cams 29 of the suction nozzle drivers 25A and 25B are rotated 180 degrees by the belt 34.

When the raising-and-lowering driving cams 29 are thus rotated 180 degrees, the swing levers 41 of the suction nozzle drivers 25A and 25B are caused to pivot about the supporting shafts 40 by the rising profiles formed on the raising-and-lowering driving cams 29. As a result, the swing lever 41 of the suction nozzle driver 25A pivots in the direction indicated by arrow F (in the counterclockwise direction), and the swing lever 41 of the suction nozzle driver 25B pivots in the direction indicated by arrow G (which is opposite from the direction of arrow F or the clockwise direction).

Figure 8:
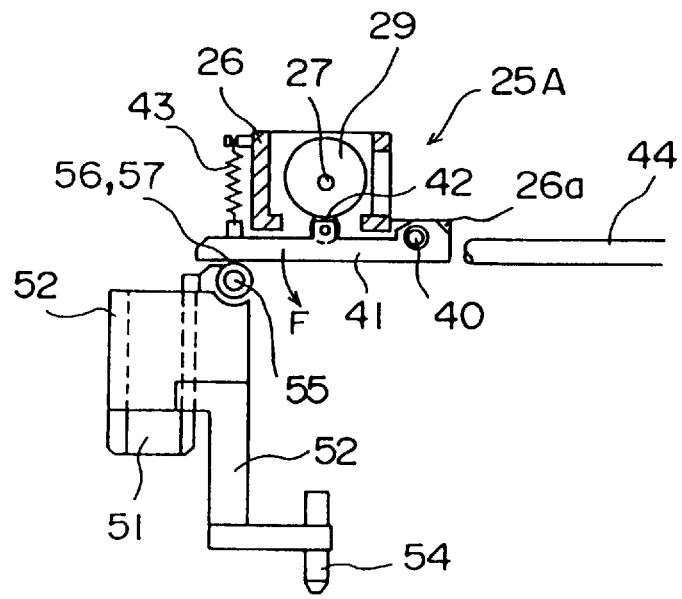
FIG. 8 is an explanatory diagram showing the state prior to the initiation of operation with the suction holding nozzle positioned above the die pick-up position.
Figure 9:
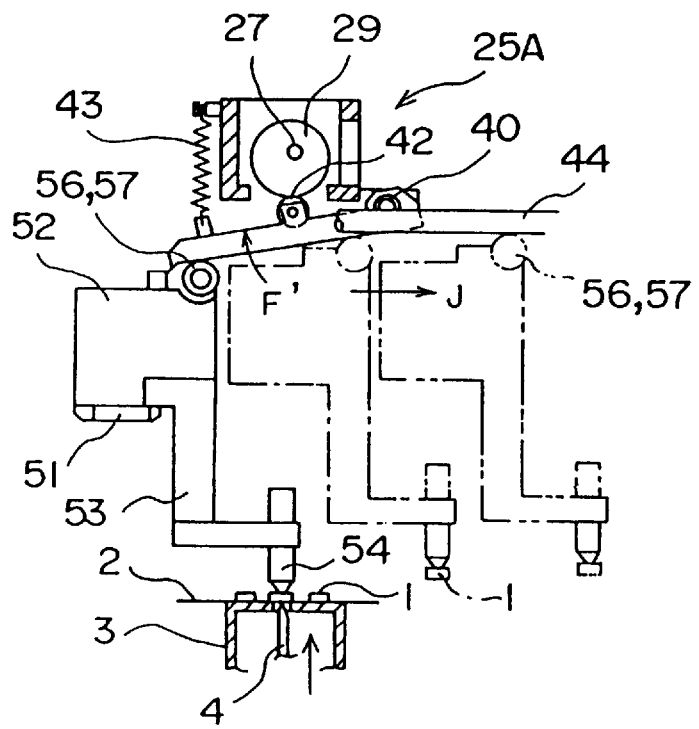
FIG. 9 is an explanatory diagram which illustrates the die pick-up operation.

When the swing lever 41 of the suction nozzle driver 25A pivots in the direction of arrow F, the roller 56 installed on the vertical slider 52 is pushed downward from the position shown in FIG. 8 into the position shown in FIG. 9. At this point, the moving plate 50 is at the location where the suction nozzle driver 25A is provided, and therefore, the roller 56 is not present at the location where the swing lever 41 of the suction nozzle driver 25B is provided; accordingly, the swing lever 41 of the suction nozzle driver 25B merely pivots in the direction indicated by arrow G.

As shown in FIG. 9, when the roller 56 is pushed down by the pivoting swing lever 41, the vertical slider 52 descends downward along the slider rail 51 so that the suction holding nozzle 54 that is mounted to the vertical slider 52 with the nozzle attachment lever 53 in between comes into contact with the die 1, and the die 1 is suction-held by the vacuum suction of the suction holding nozzle 54.

Next, the push-up needle 4 is raised; and at the same time, the vertical driving motor 30 is actuated so as to rotate in the reverse direction, and the driving motor 19 is also caused to rotate in the forward direction.

When the vertical driving motor 30 is actuated in the reverse direction, the raising-and-lowering driving cams 29 are rotated in the opposite direction from that described above. As a result, the swing lever 41 of the suction nozzle driver 25A is caused to pivot back in the direction of arrow F' by the dropping profile of the corresponding raising-and-lowering driving cam 29 and by the spring force of the spring 43.

When, as described above, the horizontal driving motor 19 is caused to rotate in the forward direction, the belt 22 is rotated in the direction of arrow H. As a result, the feed screw 16 is rotated in the forward direction, and the ball slider 15, moving plate 50 and slider rail 51 are moved in the direction of arrow I (see FIG. 1).

As described above, the vertical slider 52 is slidably installed on the slider rail 51 and pressed by the spring 58 against the swing lever 41 via the roller 56 of the suction nozzle driver 25. Accordingly, by way of the combination of the movement of the swing lever 41 in the direction indicated by arrow F' and the movement of the moving plate 50 and slider rail 51 in the direction indicated by arrow I, the roller 56 (and therefore the vertical slider 52) is, as shown in FIG. 9, ascended and moved in the direction of arrow J along the swing lever 41. Accordingly, the push-up needle 4 and the suction holding nozzle 54 are ascended upward in synchronization so that the suction holding nozzle 54 picks up the die 1 from the wafer sheet 2.

As described above, the suction holding nozzle 54 is moved in the direction of arrow J while being ascended. As a result, the roller 57 provided on the vertical slider 52 comes into contact with the under surface of transport guide shaft 44, and thus the upper limit of the ascending movement of the vertical slider 52 is restricted by the guide shaft 44.

Afterward, the ball slider 15, moving plate 50 and slider rail 51 are moved in the direction of arrow I by the horizontal driving motor 19. During this horizontal movement, the roller 57 rotates and moves along the transport guide shaft 44.

While the roller 57 moves along the transport guide shaft 44, the vertical driving motor 30 again rotates 180 degrees in the forward direction. As a result, the swing lever 41 of the suction nozzle driver 25B (and also the lever 41 of the nozzle driver 25A) is caused to pivot in the clockwise direction about the supporting shaft 40 by the rising profile of the raising-and-lowering driving cam 29 installed in the suction nozzle driver 25B, and the swing lever 41 comes into the position shown in FIG. 10.

In the meantime, when the suction holding nozzle 54 is ascended as described above, the wafer sheet 2 is driven in the X and Y directions so that next die 1 that is to be picked up is moved to the die pick-up position.

Figure 10:
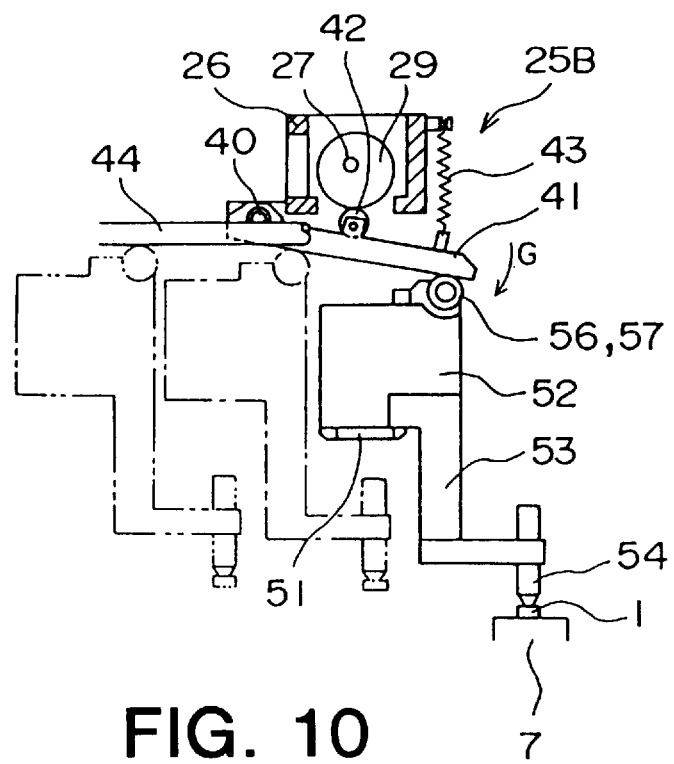
FIG. 10 is an explanatory diagram illustrating the operation by which the die is transported to the die placement stage.

When the roller 57 is moved along the transport guide shaft 44 in the direction indicated by arrow J (as described above), the roller 56 comes into contact with the swing lever 41 of the suction nozzle driver 25B; as a result, the roller 56 is subsequently moved along the swing lever 41 which is pivoted as shown in FIG. 10. In other words, the nozzle attachment lever 53 and the suction holding nozzle 54 mounted thereon descend while moving in the direction of arrow J.

When the die 1 that is suction-held by the suction holding nozzle 54 comes into contact with the die placement stage 7 or lead frame (not shown) that is placed on the die placement stage 7, the horizontal driving motor 19 is deactivated.

Afterward, the horizontal driving motor 19 is reactivated so as to rotate in the reverse direction, and the suction holding nozzle 54 is operated reversely to that described above, thus returning the die transporting device to the state shown by the solid lines in FIGS. 1, 2 and 3 and 8.

As a result, the series of transport operations for one die 1 is completed, and these series of operations are repeated.

As seen from the above, the suction holding nozzle 54 picks up a die 1 at the die pick-up position 5, ascends while holding the die, moves toward the die placement position 6, and then descends while still being moved before reaching the die placement position 6. After releasing the die 1 onto the die placement position 6, the nozzle 54 is moved back toward the die pick-up position 5 after being ascended. Accordingly, the die transporting time can be short, and productivity can be improved.

As described in detail in the above, in the die transporting device of the present invention:

a slider rail has a guide surface which is vertically oriented, a slider is provided so as to be descended and ascended on the slider rail, a suction holding nozzle is provided on the slider via a nozzle attachment lever, a horizontal driving means moves the slider rail horizontally so that the suction holding nozzle is moved from a die pick-up position to a die placement position, a horizontal guide means is provided horizontally so as to define the upper-limit position of the ascending movement of the slider and guide the slider to make a horizontal movement, a pair of swing levers are respectively pivotally installed above the die pick-up position and die placement position so that the swing levers guide the slider to make ascending and descending movements, and a vertical driving means causes the pivotal motion of the pair of swing levers.

Accordingly, the die can be rapidly transported from the die pick-up position to the die placement, so that productivity can be improved.

We claim:

1. A die transporting device comprising:

a slider rail having a guide surface which is vertically oriented, a slider which is installed so as to be descended and ascended on said slider rail, a suction holding nozzle mounted on said slider via a nozzle attachment lever, a horizontal driving means which causes said slider to make a horizontal movement of said slider so that said suction holding nozzle is moved between a die pick-up position and a die placement position, a transport guide member which is installed horizontally so that said guide member regulates an upper-limit position of an ascending motion of said slider during a horizontal movement of said slider rail, a pair of swing levers which are respectively installed in a pivotal fashion on said die pick-up position and on said die placement position so as to guide said slider upward and downward, and a vertical driving means which causes a pivot motion of said pair of swing levers.

2. A die transporting device according to claim 1, wherein said pair of swing levers are provided above said die pick-up position and die placement position and supporting shafts for said pair of swing levers are located on inner sides of said die pick-up position and said die placement position.

3. A device for transporting a die from one point to another point comprising:

a guide rail means provided with a sliding means thereof so that said sliding means is moved between said one point and said other point, said sliding means being provided with a die holding means;

a first vertical motion means which is provided above said one point and causes said die holding means to make a vertical movement above said one point so as to hold said die from said one point; and a second vertical motion means which is provided above said other point and causes said die holding means to make a vertical movement above said other point so as to release said die onto said other point.

4. A die transporting device for transporting a die from one point to another point comprising:

a horizontal guide means provided with a sliding means which is slidable along said horizontal guide rail;

a suction holder carrying means provided on said sliding means, said suction holder carrying means being installed with a die holding means;

a first vertical guide means provided above said one point so as to guide said suction nozzle carrying means in a vertical direction;

a second vertical guide means provided above said other point so as to guide said suction nozzle carrying means in a vertical direction;

a vertical driving means linked to said first and second vertical guide means so as to cause a vertical motion of said suction nozzle carrying means; and a horizontal driving means linked to said suction holder carrying means so as to cause said suction holder carrying means to move between said one point and said another point.

5. A die transporting device according to claim 4, further comprising a transport guide member which is installed horizontally so as to guide said sliding means to move horizontally.

* * * * *